United States Patent [19]

Chen

[11] Patent Number: 5,726,469

[45] Date of Patent: Mar. 10, 1998

[54] SURFACE VOLTAGE SUSTAINING STRUCTURE FOR SEMICONDUCTOR DEVICES

[75] Inventor: Xingbi Chen, Chengdu, China

[73] Assignee: University of Elec. Sci. & Tech. of China, Chengdu, China

[21] Appl. No.: 504,384

[22] Filed: Jul. 19, 1995

[30] Foreign Application Priority Data

Jul. 20, 1994 [CN] China .................. 94111842.8
Jul. 6, 1995 [CN] China .................. 95108317.1

[51] Int. Cl.⁶ .......................... H01L 29/80; H01L 31/112
[52] U.S. Cl. .......................... 257/285; 257/287; 257/335; 257/345; 257/399; 257/546; 257/550; 257/652
[58] Field of Search .................. 257/652, 629, 257/630, 550, 546, 583, 285, 287, 335, 345, 399, 484, 485

[56] References Cited

U.S. PATENT DOCUMENTS

| 4,691,224 | 9/1987 | Takada | 257/652 X |
| 5,355,011 | 10/1994 | Takata | 257/345 X |

FOREIGN PATENT DOCUMENTS

| 60-124865 | 7/1985 | Japan | 257/652 |
| 60-257572 | 12/1985 | Japan | 257/652 |
| 63-122277 | 5/1988 | Japan | 257/345 |
| 63-156360 | 6/1988 | Japan | 257/652 |
| 4260375 | 9/1992 | Japan | 257/652 |
| 2167229 | 5/1986 | United Kingdom | 257/652 |

OTHER PUBLICATIONS

Ochi et al., "Computer Analysis of Breakdown Mechanism in Planar Power of MOSFET'S", IEEE Transactions on Electron Devices, vol. ED-27, No. 2, Feb. 1980.

Baliga et al., "High-voltage device termination of techniques, A comparative review", IEEE Proc., vol. 129, Pt. 1, No. 5, Oct. 1982.

Wildi et al., "Modeling and Process Implementation of Implanted Resurf Type Devices", IEEE 1982, pp. 268-271.

Chen et al., "Theory of Optimum Design of Reverse-Biased p-n Junctions Using Resistive Field Plates and Variation Lateral Doping", Solid State Electronics vol. 35, No. 9, pp. 1365-1370, 1992.

Primary Examiner—William Mintel
Attorney, Agent, or Firm—Pennie & Edmonds LLP

[57] ABSTRACT

A surface voltage sustaining structure around an $n^+$ (or $p^+$)-type region on a $p^-$ (or $n^-$)-type substrate for high-voltage devices is made by a combination of n-type regions and/or p-type regions and produces an effective surface density of donor (or acceptor) decreasing with the distance to the $n^+$ (or $p^+$)-type region on the surface, when all of the regions are depleted under reverse breakdown voltage. The surface voltage sustaining structure can make the breakdown voltage of the $n^+$-$p^-$ (or $p^+$-$n^-$)-junction reach more than 90% of that one-sided parallel plane junction with the same substrate doping concentration. High-voltage vertical devices as well as high-voltage lateral devices with fast response, low on-voltage and high current density can be made by using this invention.

8 Claims, 5 Drawing Sheets

SURFACE VOLTAGE SUSTAINING STRUCTURE FOR SEMICONDUCTOR DEVICES

TECHNICAL FIELD

This invention relates to a semiconductor high-voltage and high power device, and more particularly to a surface voltage sustaining structure for semiconductor devices.

BACKGROUND OF THE INVENTION

It is well known that the breakdown voltage of a planar $n^+$-$p^-$ (or $p^+$-$n^-$) junction is normally restricted by the surface breakdown. This phenomenon is explained by FIG. 1, a cross-sectional region of a planar $n^+$-$p^-$ (or $p^+$-$n^-$)-junction, as follows.

In FIG. 1, 1 refers to a $p^-$ (or $n^-$)-substrate, 2 refers to an $n^+$ (or $p^+$)-region. Under a reverse voltage, the field along a middle line of the structure is vertical with a maximum value at an $n^+$-$p^-$ (or $p^+$-$n^-$) metallurgical junction with its integral along the said line equal to the reverse voltage, whereas the field along the surface has almost only lateral component with its integral along the surface also equal to the reverse voltage. Owing to the curvature effect, the field along the surface is very uneven and has a very high value near the $n^+$ (or $p^+$)-structure. This high field normally causes the breakdown voltage of avalanche impact ionization much lower than that of an one-sided parallel plane junction with the same substrate.

In order to enhance the surface breakdown voltage of the planar junction, there are a number of techniques available, called planar junction termination techniques (JTT's). For references of planar JTT's see: [1] B. J. Baliga, IEE proc., vol. 129, Pt. I, No. 5, pp. 173–179 (1982). Among the planar JTT's, there are only three techniques that can make the breakdown voltage reach 90% of that of a one-sided parallel plane junction with the same substrate: junction termination extension (JTE), variational lateral doping (VLD) and resistivity field plate (RFP). With the JTE technique, one can not obtain a maximum breakdown voltage with the smallest distance on the surface. With the conventional VLD technique, deep diffusion of the junctions must be used, which is not compatible with modern sub-micron technology. With the RFP technique, additional complicated technology is needed to fabricate a resistive film. Moreover, with any of the said three techniques, the surface voltage sustaining structure can not be simultaneously a drift region with low on-resistance for the lateral devices.

In order to improve the breakdown voltage as well as to reduce the on-resistance of the lateral MOST, there are two techniques available namely, the offset-gate technique and the reduced surface field (RESURF) technique. For references of these two techniques see: [2] S. Ochi, et al., IEEE Trans. Electron Devices, vol. ED-27, p. 399 (1980); [3] E. J. Wildi, et al., IEDM Digest p. 268 (1982). However, both of these two techniques normally need a particular ion-implantation process, and they yield lower on-resistance (for MOST's) or lower base-resistance (for vertical bipolar transistors) while higher breakdown voltage is obtained.

SUMMARY OF THE INVENTION

The object of the present invention is to provide a new surface voltage sustaining structure. By using the surface voltage sustaining structure of this invention, the highest breakdown voltage with the smallest surface distance can be obtained in a semiconductor substrate with a certain resistivity, and lower on-resistance (for MOSTs') or lower base-resistance (for vertical bipolar transistors) can be obtained. The structure of the present invention accommodates considerable flexibility for making the high voltage devices compatible with the modern sub-micron technology. Based upon such flexibility, high voltage integrated circuits (HVIC's) and power integrated circuits (PIC's) with higher performances and lower costs can also be implemented in BiCMOS and CMOS.

This invention is conceived from a theory of optimum variational lateral doping proposed by the inventor, see reference [4] X. B. Chen, et al., Solid-State Electronics, vol. 35, pp. 1365–1370 (1992). However, different structures to approach such optimum variational lateral doping and their application to different devices are provided in this invention.

The object of the present invention is realized by a surface voltage sustaining structure for a semiconductor device of the present invention, the semiconductor device is based on a heavily doped region of a second conductivity type on the top of a lightly doped substrate of a first conductivity type. The surface voltage sustaining structure of the present invention is located around said heavily doped region, and has an average doping density of the second conductivity type decreasing from a value about $N_B W_{pp}$ gradually or stepwisely with the increasing of the distance to said heavily doped region of a second conductivity type, under the condition that said structure is totally depleted under a reverse voltage close to the breakdown voltage applied to said heavily doped region of a second conductivity type and the substrate, where $N_B$ is the doping concentration of the substrate, $W_{pp}$ is the depletion width of an abrupt parallel plane junction made by the substrate under its breakdown voltage, and the average doping density of the second conductivity type refers to the average number of the effective ionized impurity atoms of the second conductivity type in a surface area, which has a lateral dimension much smaller than $W_{pp}$ but larger than the thickness of the surface region.

The present invention also provides a surface voltage sustaining structure, wherein the average doping density of the second conductivity type in the surface voltage sustaining structure is formed by a local compensation of the impurity atoms of the first conductivity type of at least one region of the first conductivity type in the surface voltage sustaining structure to the impurity atoms of the second conductivity type of at least one region of the second conductivity type in the surgace voltage sustaining structure, where the bottom of the surface voltage sustaining structure is a region of the second conductivity type, and the average doping density of the second conductivity type refers to the average number of ionized impurities of the second conductivity type in the region (s) of the second conductivity type deducted by the average number of ionized impurities of the first conductivity type in the region(s) of the first conductivity type in the surface area.

The present invention still provides a surface voltage sustaining structure, wherein a region with uniform doping density of the second conductivity type is used and the region of the first conductivity type for compensation on the top has several structures as follows:

a) multiple continuous zones with impurity density of the first conductivity type increased zone by zone in accordance with the distance to the said heavily doped region of a second conductivity type;

b) at least one zone in the region of the first conductivity type is replaced by a plurality of separate small zones of the first conductivity type;

c) a region of the first conductivity type with saw-tooth-like area for compensation located on the top of a region with a uniform impurity density of the second conductivity type;

d) at least two separate zones of the first conductivity type with different lengths stacked inside the region of the second conductivity type.

The present invention provides still another structure, wherein said substrate of the first conductivity type is separated from said heavily doped region of the second conductivity type and the surface voltage sustaining structure by a thin insulator layer, but said substrate is electrically connected to the ends of said surface voltage sustaining structure.

In the surface voltage sustaining structure, the impurities of the first conductivity type form a compensation to the impurities of the second conductivity type. Said compensation in this invention means the approximate offset of the effects of ionized impureties to the peak field when the surface voltage sustaining structure is fully depleted under a reverse voltage close to the breakdown voltage. For instance, at a place of the surface voltage sustaining structure, the upper region of which is p-type, the lower region of which is n-type with doping density higher than the upper region, the effects of the ionized acceptors to the peak field are almost compensated by a part of the ionized donors beneath them.

In the modern sub-micron technology, the breath of the zones of the first conductivity type and the lateral distances between the neighboring zones can be made smaller than 3 μm, the thickness of the surface voltage sustaining structure is normally around 1 μm, whereas the depletion width of the substrate of a one-sided parallel plane junction under the breakdown voltage is mostly around 20 μm. Therefore, the surface voltage sustaining structure of this invention can be readily to be implemented by ion-implantation with adequate masks and different kinds of high voltage devices compatible to the sub-micron technology are feasible.

It is apparent that if there is a thin insulator region between the substrate of the first conductivity type and heavily doped region of the second conductivity type as well as said surface sustaining structure, the field profile will not change appreciably so long as the substrate is electrically connected to the outer periphery of the surface sustaining structure. That is to say, this invention can also be used to the semiconductor on insulator on semiconductor (SIS, or SOS, if the insulator is an oxide) to obtain high voltage lateral devices.

These and other features, and advantages, will be more clearly understood from the following detailed description taken in conjunction with the accompanying drawings.

BRIEF DESCRIPTION OF THE DRAWINGS

FIG. 8 shows schematically the cross-section of the surface voltage sustaining structure of this invention, which has an oxide layer beneath it.

DETAILED DESCRIPTION OF THE INVENTION

Figure 1:
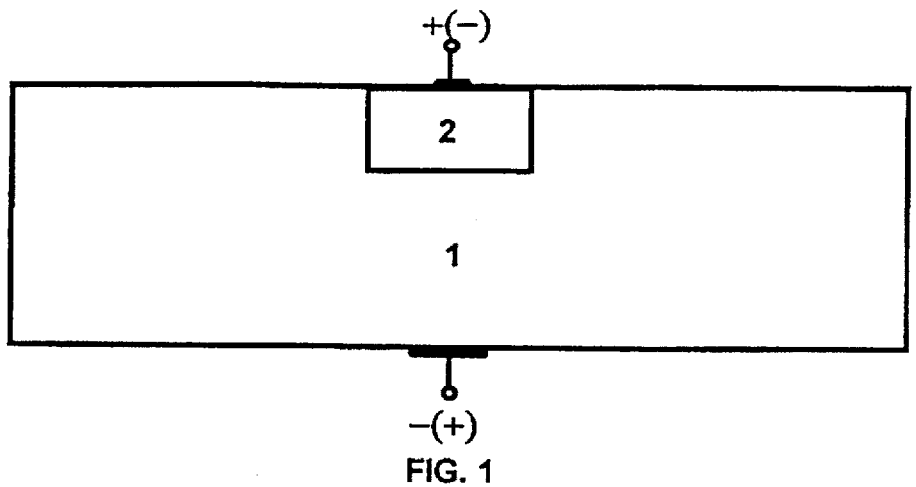
FIG. 1 shows schematically the cross-section of a common plan junction.
Figure 2:
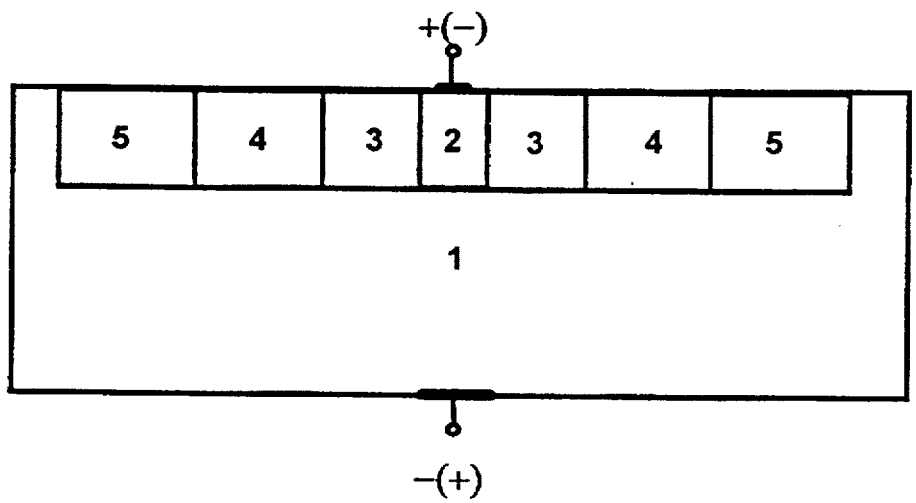
FIG. 2 shows schematically the cross-section of the structure of a planar junction with the surface voltage sustaining structure of this invention.

By referring to FIG. 2, the improvement of the breakdown voltage of the planar junction through the surface voltage sustaining structure of the present invention is explained as follows. In this figure, 1 is a $p^-$-substrate, 2 is an $n^+$-region, 3, 4 and 5 are n-regions, where region 3 has a doping density about $N_B W_{pp}$, the doping density of 4 is lower than that of region 3 and the doping density of 5 is lower than that of region 4. Under a reverse voltage close to the breakdown voltage of the one-sided parallel plane junction made by the same substrate, the field at the boundary of region 2 is much reduced due to that the additional field produced by the ionized impurities in region 3 at this boundary is opposite to the original field. Similarly, the field at the boundary of region 3 and region 4 is much reduced due to the existence of region 4 than the case of without region 4; the field at the boundary of region 4 and region 5 is much reduced due to the existence of region 5 than the case of without region 5. The field at the outer boundary of region 5 is very small owing to the fact that region 5 is a lightly doped region and the voltage between region 5 and the substrate is very low due to that a great part of the reverse voltage has been absorbed in the distance from region 2 to the outer boundary of region 3. Accordingly, the breakdown voltage of the planar junction can reach 90% of that of an one-sided parallel plane junction made by the same substrate.

In order to realize the requirement that the average doping density of the second type in the surface voltage sustaining structure decreases in accordance with the distance to the heavily-doped region 2, another approach beside the above mentioned method using regions 3,4 and 5 is to use some regions of the first conductivity type for local compensation of the heavily-doped region 2, which are then extended over the whole surface voltage sustaining structure.

Figure 3:
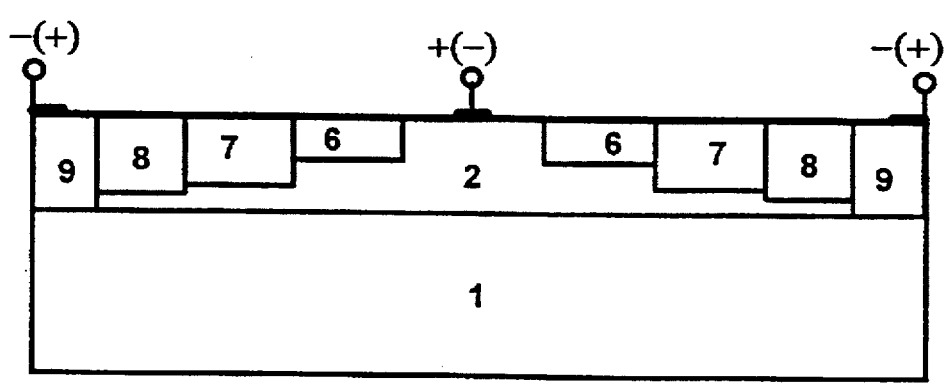
FIG. 3 shows schematically the cross-section of the surface voltage sustaining structure of this invention, which consists three continuous zones.

FIG. 3 shows a surface voltage sustaining structure by using the above approach. In this figure, 1 stands for the p⁻-substrate, 2 stands for the n⁺-region; 6, 7 and 8 are regions with doping density of acceptors increasing in that order. Under a high reverse voltage applied between the central part of region 2 and the substrate, regions 6, 7 and 8 and the part of the region 2 under them are all fully depleted. A part of the electric flux produced by the ionized donors of this part of region 2 are terminated immediately at the ionized acceptors above them (i.e., in region 6, region 7 and region 8). The remaining flux density of region 2 has almost the same effect to the peak field as that of regions 3, 4 and 5 in FIG. 2. In other words, the field profiles along the metallurgical junction of region 2 and the substrate produced by FIG. 3 (the compensation method) and FIG. 2 are almost the same.

Region 9 in FIG. 3 is a pure p-region connected directly to the substrate 1. With region 9, the external voltage can be applied to the central part of region 2 and region 9 instead of to the central part of region 2 and the bottom of the substrate 1.

Figure 4:
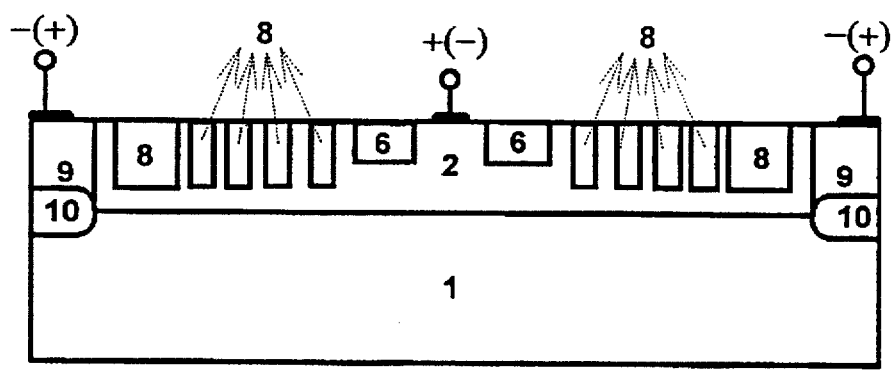
FIG. 4 shows schematically the cross-section of the surface voltage sustaining structure of this invention, which consists two zones with different doping density and plurality of small zones with a constant doping density in-between them.

FIG. 4 is a variation structure of FIG. 3. In FIG. 4, a plurality of separated small zones 8 is used to replace region 7 in FIG. 3. The average acceptor density of these zones can be adjusted by the filling factor thereof, so that it can be changed gradually from the acceptor density of region 6 to the acceptor density of region 8. The acceptor doping density of these small zones are the same as region 8, so that the processing for producing region 7 is eliminated and thereby the cost could be reduced.

Region 10 in FIG. 4 is a heavily-doped buried p-region, which is used to make better conduction between region 9 and the substrate 1.

Figure 5:
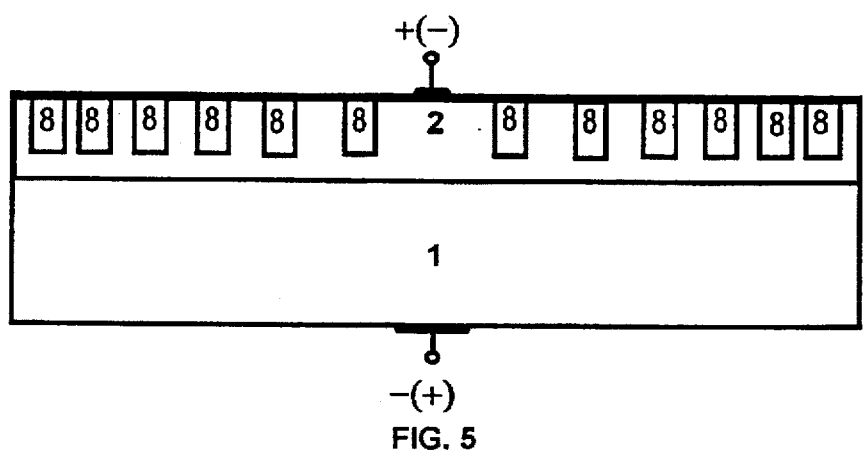
FIG. 5 shows schematically the cross-section of the surface voltage sustaining structure of this invention, which consists of plurality of small zones with a constant doping density.

FIG. 5 shows the cross-section of another surface voltage sustaining structure according to the present invention. In this structure, a plurality of separate small zones 8 are used for compensating the doping of region 2, so that the average donor density decreases with the increasing of the distance to the central part of the region 2 by varying the filling ratio of these zones. In this structure, both processes for producing regions 6 and 7 in FIG. 3 are removed, and therefore cost may be further reduced.

Figure 6:
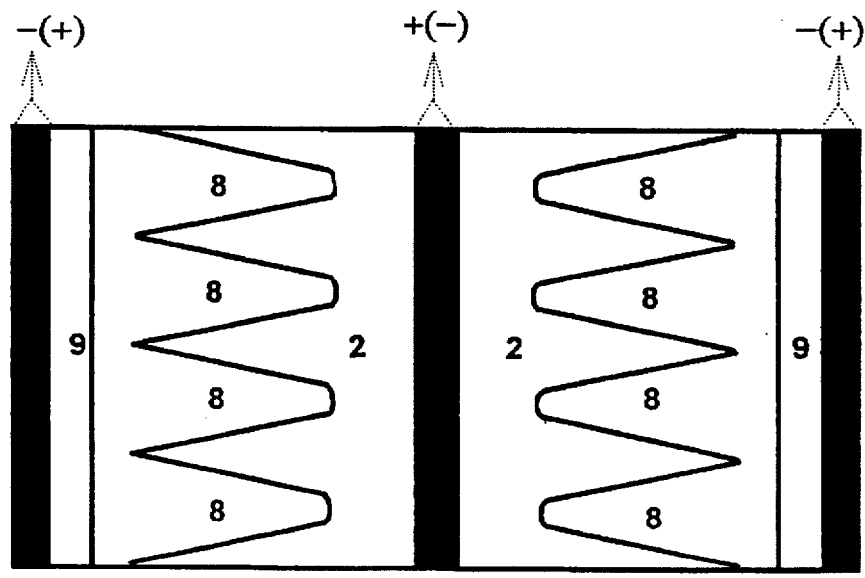

FIG. 6 shows the top-view of a surface voltage sustaining structure of the present invention. The p-type impurities for compensating the donors in the region 2 is located in a saw-tooth-like area, so that the average acceptor density increases with increasing of the distance to the central part of region 2. Thus, the average effective donor density decreases with the increasing of the distance to the central part of the region 2. In FIG. 6, region 9 is a pure p-region and connected directly to the substrate, and black parts indicate electrodes.

Figure 7:
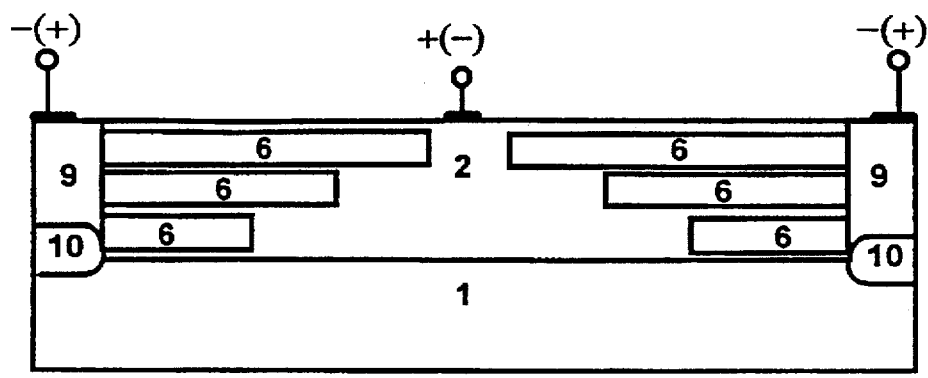
FIG. 7 shows schematically the cross-section of the surface voltage sustaining structure of this invention, which consists plurality of separate layers.

FIG. 7 shows a variation of the surface voltage sustaining structure of the present invention. In this structure, the p-type impurities are doped in three separate horizontal layers 6 with different lengths, instead of one p-layer in region 2. Following the distance from the central part of region 2, the number of p-type layers for compensation increases from one to three, thus, the average effective donor density in the surface voltage sustaining structure decreases in accordance with the distance to the central part of region 2.

From above discussion on FIGS. 3–7, it is apparent that the surface voltage sustaining structure of this invention not only yields the highest breakdown voltage within the minimum distance on the surface, but also provides great flexibility of the technology of implementation. If there are three processes available for producing regions 6,7 and 8, then the structure shown in FIG. 3 can be adopted. If there are two processes available for producing regions 6 and 8, then the structure shown in FIG. 4 can be adopted. If there is only one process available for producing region 6 but it can be repeated several times, then the structure shown in FIG. 7 can be adopted.

Figure 8:
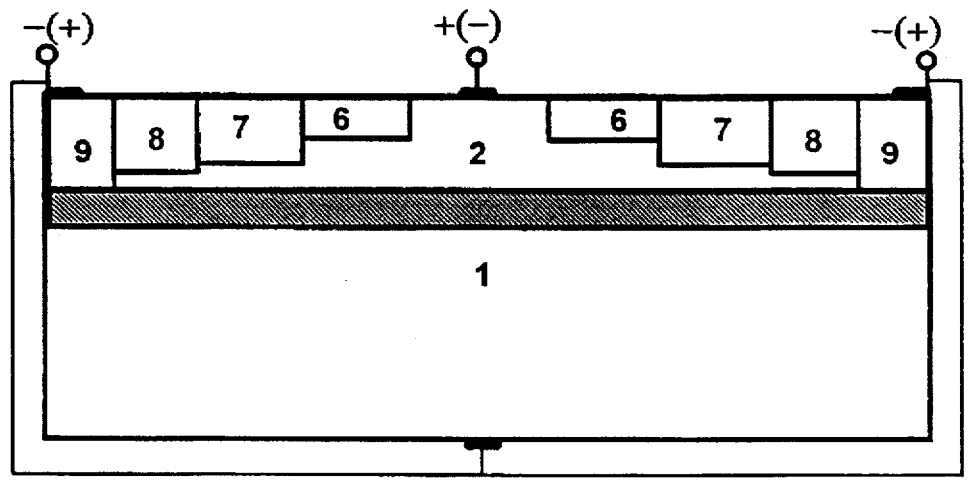
FIG. 8 shows schematically a top view of the surface voltage sustaining structure of this invention, which consists of a saw-tooth-like region on the top.

FIG. 8 shows a surface voltage sustaining structure, where a thin insulator layer, e.g., oxide layer, is located in-between the substrate 1 and the surface voltage sustaining structure. Evidently, the thin insulator layer will not change appreciably the field profile from that of without the insulator layer, so far as there is an electrical connection between the substrate and the outer part of the surface voltage sustaining structure. Therefore, the surface voltage sustaining structure of this invention can also be applied to a SIS device (or SOS device, if the insulator layer is an oxide layer).

Figure 9:
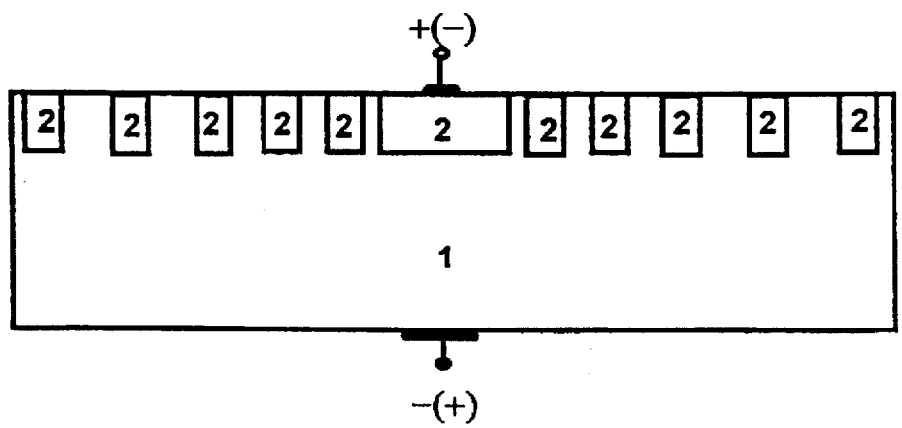
FIG. 9 shows schematically the cross-section of the surface voltage sustaining structure of this invention, which consists plurality of small separate zones to make the average doping density vary with the distance to the central part through their filling ratio.

FIG. 9 shows another surface voltage sustaining structure. In this structure, no impurity compensation is used. The variation of the donor density in the surface voltage sustaining structure is realized by plurality of separated small n-zones. The filling factor of the small zones decreases with the distance to the central part of region 2, so that the average donor density can be varied with the distance as required.

In FIGS. 3–9, the surface voltage sustaining structures have at least three sections of different effective doping density. The breakdown voltage can reach 90% of that of a one-sided parallel plane junction with the same substrate. The conventional RESURF technique corresponds to only one section, yielding much lower breakdown voltage than this invention.

In the examples shown in FIG. 3–FIG. 9, the required variation of effective donor density of the surface voltage sustaining structure are all made by introducing a plurality of p-regions in an n-region with uniform density. It is apparent and needs not to mention for those skilled in the art, that one can also use only one p-region with uniform density on plurality of n-regions with different doping densities to achieve the same required variation of the effective donor density. Moreover, one can use a plurality of p-regions and plurality of n-regions to achieve the same required variation of the effective donor density.

In the description stated above, substrate 1 is p⁺-type and region 2 is n⁺-type. It is apparent for those skilled in the art, that the surface voltage sustaining structure presented in this invention can also be used for the case of that substrate 1 is n⁺-type and region 2 is p⁺-type, just by changing all the "n" to "p" and vice versa.

The inventor has also investigated the breakdown voltage at the ends of the fingers of the interdigitate layout of the lateral MOSFET by using cylindrical coordinates and found that the same breakdown voltage can be obtained by changing the relative lengths of the sections while keeping the total length of the surface voltage sustaining structure unchanged. However, the ends of the fingers of the interdigitate a layout is not appropriate to be used as active structures.

Examples to implement different devices using the surface voltage sustaining structure of this invention are as follows:

1) High-voltage diodes. The implementation can be done by simply changing the + (or −)-mark in FIG. 3–7 to anode A (or cathode K) and changing the − (or +)-mark to cathode K (or anode A). To make the ohmic contacts of the electrodes, heavily doped regions with the same conductivity type beneath the electrodes can be used and these heavily doped regions are defaulted in all the figures. In addition, in FIGS. 3, 4 and 6, the anode contacts A (or cathode K) can be either made at the bottom of the substrate, or made at the top of a p (or n)-region 9.

Figure 10:
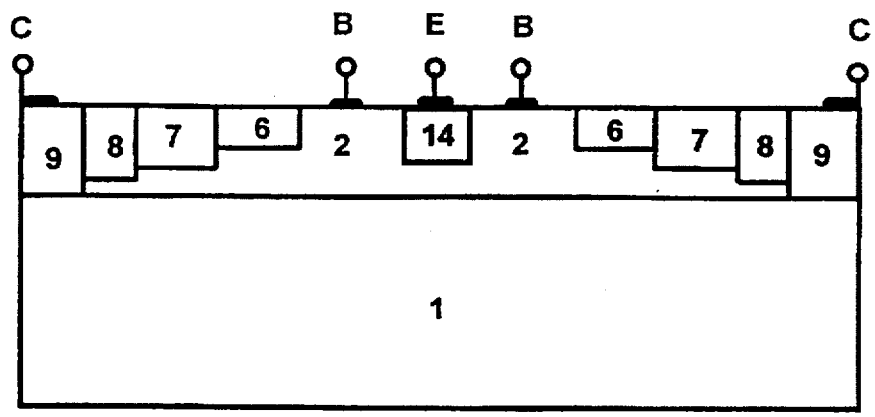
FIG. 10 shows schematically the cross-section of a high voltage bipolar transistor with the surface voltage sustaining structure shown in FIG. 3.

2) High-voltage bipolar transistors. This can be done by using a $p^{+ \text{ (or } n^+)}$-region serving as emitter E, which is inserted in the middle of region 2 in FIGS. 3–7. Region 2 itself is the base B, and the collector C is made on region 9. FIG. 10 shows an example of high-side-control vertical transistors using the surface voltage sustaining structure of FIG. 3. In this example, a region 14 as emitter E is formed in the middle potion of region 2.

Figure 11:
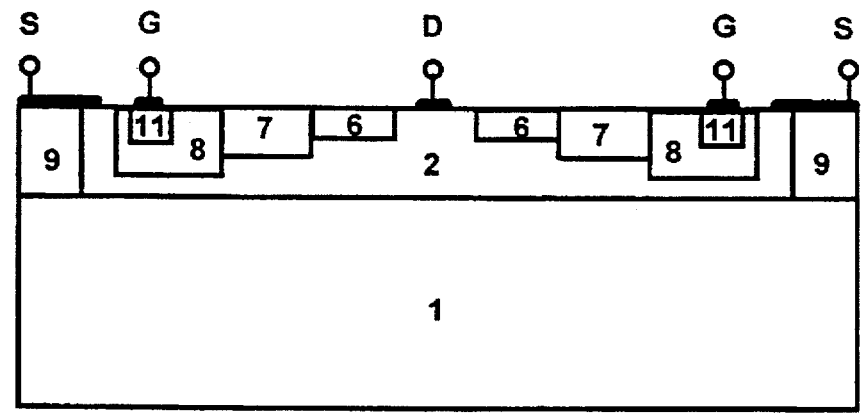
FIG. 11 shows schematically the cross-section of a high voltage JFET with the surface voltage sustaining structure shown in FIG. 3.

3) High voltage lateral junction field effect transistor (JFET). This can be done by using the middle of region 2 in FIGS. 3–7 as the drain D. FIG. 11 shows an example of a JFET using the surface voltage sustaining structure of FIG. 3. The source S is formed at the end of the surface voltage sustaining structure. The source contact is not only connected directly to region 2 at the ends of the surface voltage sustaining structure, but also connected through region 9 to the substrate. The gate is made on the p-region at the ends of the surface voltage sustaining structure (region 8) through a $p^+$-region 11, which serves for the contact of the gate G. The conduction of the channel (2) beneath region 8 is controlled by the gate voltage applied to region 8.

Figure 12:
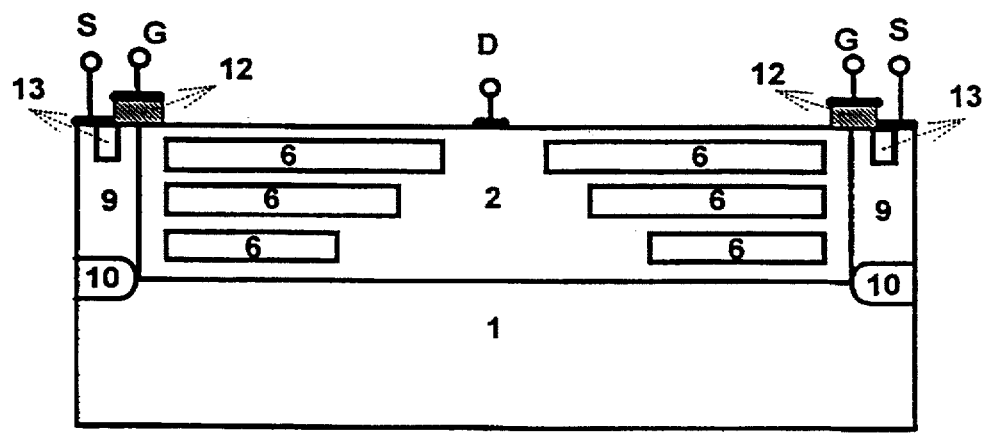
FIG. 12 shows schematically the cross-section of a high voltage MOSFET with the surface voltage sustaining structure shown in FIG. 7.

4) High voltage lateral metal-oxide-semiconductor field effect transistor (MOSFET). FIG. 12 shows an example of a MOSFET using the surface voltage sustaining structure of FIG. 7. The drain D of the MOST can be made the same as in JFET. A $n^+$-region 13 serving as the source S is set in region 9 which serves as the source-body. The source electrode contacts both region 13 and region 9. The gate G is set on the top of an oxide layer 12 which is formed on the semiconductor surface. The gate is extended from region 13 to a part of region 2 beyond the surface voltage sustaining structure, which has no region with opposite conductivity type on its top. The ionized impurities of this part has no appreciable effect to the field profile around the peak, because this part is very short and the electric flux produced by them are mostly terminated immediately by their induced charges at region 9 and the $p^+$-buried region 10.

The MOSFET using the structure of FIG. 7 yields a very low on-resistance besides high breakdown voltage.

The inventor has investigated a 0.8 μm BiCMOS technology and found that a breakdown voltage of 90% of that of the parallel plane junction with the same substrate doping concentration can be reached by using the surface voltage-sustaining structure shown in FIG. 3, and the lateral MOSFET with this surface voltage sustaining structure has low on-resistance, high respond speed and large current density. The figure of merit FM of this kind of lateral MOSFET is:

$$FM \equiv \frac{(\text{breakdown voltage}) \times (\text{current density})}{(\text{turn-off time})} = 18 \text{ kV} \cdot \text{A/cm}^2 \cdot \mu\text{S}$$

which is 250 times of that of the conventional lateral MOSFET.

5) High voltage insulated gate bipolar transistor (IGBT). This can be made like MOSFET. The differences to the MOSFET are as follows: A $p^+$-region 14 serving as anode A (o rcathode K) is set at the middle top of region 2; the cathode K (or anode A) is set as the same as the source in the said lateral MOST.

Figure 13:
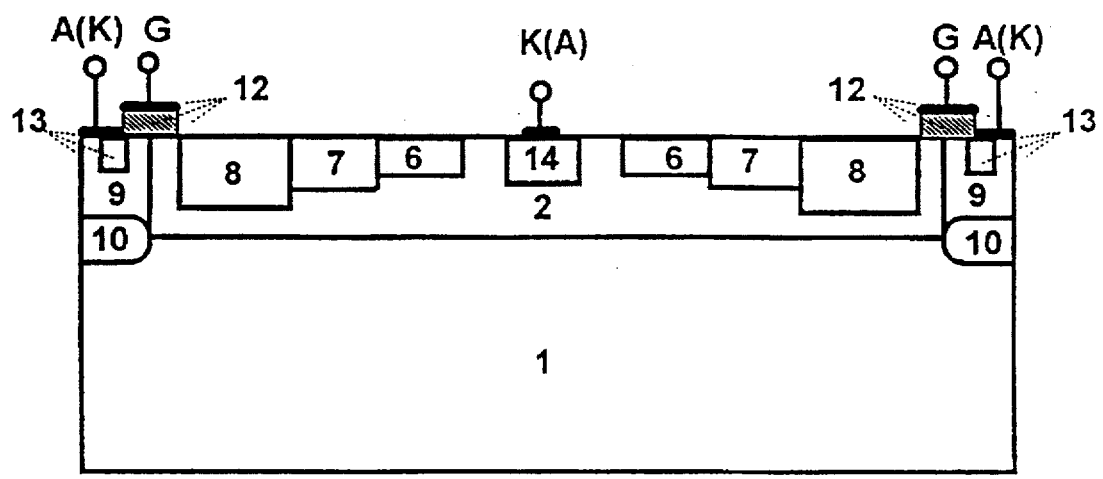
FIG. 13 shows schematically the cross-section of a high voltage IGBT with the surface voltage sustaining structure shown in FIG. 3.

FIG. 13 shows the cross-section of an IGBT using the surface voltage sustaining structure of FIG. 3.

An example of processing the structure shown in FIG. 13 is following: 1) starting with a $p^-$-substrate 1 of doping concentration around $1\times10^{15}$ cm$^{-3}$ and ion-implanting Boron with dose around $4\times10^{12}$ cm$^{-2}$ for buried layer 10; 2) epitaxying an $n^-$-layer with thickness around 1 μm over the sustrate 1; 3) ion- implanting phosphor with dose around $3\times10^{12}$ cm$^2$ for region 2, which has a Gaussian distribution with peak around 0.8 μm in depth and spread around 0.4 μm after the whole processing; 4) ion-implanting Boron with dose around $2\times10^{12}$ cm$^{-2}$ for region 8 and region 9, wherein region 8 has the Gaussian distribution with peak at the surface and spread around 0.4 μm; 5) ion-implanting boron with dose around $1\times10^{12}$ cm$^{-2}$ for region 6 and region 9; 6) ion-implanting Boron with dose around $1.7\times10^{12}$ cm$^{-2}$ for region 7. The remaining processes are abbreviated since these processes are normal processes known by those skilled in the art. Regions 6 and 7 have the same depth and spread as region 8. All of the ion-implantation stated above are effected through adequate masks. Region 9 is a pure p-region because of said steps of 1), 4), and 5).

In this invention, the compensation effect of the regions with opposite conductivity type is used in the surface voltage sustaining structure to approach the ideal field profile. This method has three advantages: (1) high breakdown voltage; (2) the flexibility in technology and the compatibility with the sub-micron technology; (3) the low on-resistance of the lateral MOSFET's or the low base resistance of the vertical bipolar transistor due to that the regions of opposite conductivity type in the structure are not fully depleted in the on-state. Obviously, high voltage integrated circuits (HVIC's) and power integrated circuits (PIC's) can be implemented with low costs and high performances by using this invention.

Evidently, the surface voltage sustaining structure of this invention can also apply to the case of a semiconductor on insulator on semiconductor (SIS) as far as the substrate is electrically connected to a structure outside of the surface voltage-sustaining structure.

In addition, the requirement of that the effective donor (or acceptor) density decreases with the distance to the center of structure 2 can also be implemented by using many small zones of a constant doping density of n (or p)-type.

Although the invention has been described and illustrated with reference to specific embodiments thereof, it is not intended that the invention be limited to these illustrative embodiments. Those skilled in the art will recognize that modifications and variations can be made without departing from the spirit of the invention. For example, the conductivity of the substrate and doped regions may be opposite of those illustrated herein. Therefore, it is intended that this invention encompass all such variations and modifications as fall within the scope of the appended claims.

I claim:

1. A surface voltage sustaining structure for a semiconductor device comprising a first semiconductor region of a second conductivity type formed on a second semiconductor region of a first conductivity type, said first semiconductor region being doped at a higher density of impurities than said second semiconductor region, said surface voltage sustaining structure comprising a third semiconductor region formed around said first semiconductor region, said third semiconductor region having an average doping density of the second conductivity type that decreases from a value of about $N_B W_{pp}$ gradually with increasing of a distance to said first semiconductor region, said third semiconductor region being depleted under a reverse voltage close to a breakdown voltage applied to a junction formed by said first and second semiconductor regions, where $N_B$ is the doping density of said second semiconductor region, and where $W_{pp}$ is the depletion width of an abrupt parallel plane junction made by said second semiconductor region, and where said average doping density of the second conductivity type of said third region refers to the average density of effectively ionized impurities of the second conductivity type in a surface area having a lateral dimension smaller than $W_{pp}$.

2. The surface voltage sustaining structure of claim 1 wherein the average doping density of the second conductivity type of the third semiconductor region is achieved by local compensation of the impurities of the first conductivity type to the impurities of the second conductivity type, where the bottom of said third semiconductor region is of the second conductivity type, and the average density of the effective ionized impurities of the second conductivity type refers to the average density of ionized impurities of the second conductivity type in the one or more regions of the second conductivity type minus the average density of the ionized impurities of the first conductivity type in one or more regions of the first conductivity type in said surface area.

3. The surface voltage sustaining structure of claim 2 wherein a region having a uniform doping density of the second conductivity type is used and the region of the first conductivity type for compensation has a plurality of continuous zones with a doping density of the impurities of the first conductivity type increasing zone by zone with the increasing of the distance to said first semiconductor region of a second conductivity type.

4. The surface voltage sustaining structure of claim 3 wherein at least one zone in the region of the first conductivity type for compensation is replaced by a plurality of separate zones of the first conductivity type that are smaller than such at least one zone.

5. The surface voltage sustaining structure of claim 2 wherein a region of the first conductivity type with sawtooth-like area for compensation is on top of the region with uniform density of the impurity of the second conductivity type.

6. The surface voltage sustaining structure of claim 2 wherein at least two separate layers of the first conductivity type with different lengths are inserted inside the region of the second conductivity type.

7. The surface voltage sustaining structure of claim 2 wherein said substrate of the first conductivity type is separated from said heavily doped region of the second conductivity type and the surface voltage sustaining structure by an insulator region, but said substrate is electrically connected to the ends of said surface voltage sustaining region.

8. The surface voltage sustaining structure of claim 1 wherein said structure comprises a plurality of small zones of the second conductivity type with a same doping density, which are separated from each other.

* * * * *